United States Patent
Rodriguez et al.

(10) Patent No.: US 7,813,193 B2
(45) Date of Patent: Oct. 12, 2010

(54) FERROELECTRIC MEMORY BRAKE FOR SCREENING AND REPAIRING BITS

(75) Inventors: John Anthony Rodriguez, Dallas, TX (US); Keith A. Remack, Richardson, TX (US); Boku Katsushi, Ibaraki (JP); John Lane Gertas, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/142,568

(22) Filed: Jun. 19, 2008

(65) Prior Publication Data

US 2009/0316469 A1 Dec. 24, 2009

(51) Int. Cl.
*G11C 29/00* (2006.01)
(52) U.S. Cl. ................... 365/200; 365/201; 365/145; 365/149; 365/49.13
(58) Field of Classification Search .............. 365/200, 365/201, 145, 149, 49.13
See application file for complete search history.

(56) References Cited

U.S. PATENT DOCUMENTS

| | | | | |
|---|---|---|---|---|
| 5,525,528 A * | 6/1996 | Perino et al. | ............... | 438/3 |
| 5,661,730 A * | 8/1997 | Mitra et al. | ............... | 714/720 |
| 5,969,935 A * | 10/1999 | Kammerdiner et al. | ..... | 361/311 |
| 6,056,994 A * | 5/2000 | Paz de Araujo et al. | ..... | 427/554 |
| 6,104,049 A * | 8/2000 | Solayappan et al. | ......... | 257/295 |
| 6,177,706 B1 * | 1/2001 | Shindo et al. | ............... | 257/347 |
| 6,238,933 B1 * | 5/2001 | Sun et al. | ............... | 438/3 |
| 6,288,961 B1 * | 9/2001 | Tanaka et al. | ............. | 365/210.1 |
| 6,658,608 B1 * | 12/2003 | Kamp et al. | ............... | 714/718 |
| 6,830,938 B1 * | 12/2004 | Rodriguez et al. | ............. | 438/3 |
| 6,944,046 B2 * | 9/2005 | Ogiwara | ............. | 365/145 |
| 7,112,952 B2 * | 9/2006 | Arai et al. | ............. | 324/158.1 |
| 7,149,137 B2 * | 12/2006 | Rodriguez et al. | ......... | 365/201 |
| 7,195,407 B2 * | 3/2007 | Van Den Nieuwelaar et al. | | 396/611 |
| 7,255,941 B2 * | 8/2007 | Kijima et al. | ............... | 428/702 |
| 2006/0133129 A1 | 6/2006 | Rodriguez et al. | | |
| 2009/0231903 A1 * | 9/2009 | Ogiwara et al. | ............. | 365/145 |

OTHER PUBLICATIONS

Jarrod Eliason et al; "An 8Mb 1T1C Ferroelectric Memory With Zero Cancellation and Micro-Granularity Redundancy" Ramtron International Corporation; Texas Instruments, USA.

* cited by examiner

*Primary Examiner*—Viet Q Nguyen
(74) *Attorney, Agent, or Firm*—Rose Alyssa Keagy; W. James Brady; Frederick J. Telecky, Jr.

(57) ABSTRACT

A method (300) of identifying failing bits in a ferroelectric memory device including at least one ferroelectric capacitor includes (302) writing same state data to the first capacitor, and (304) baking the first capacitor for a first specified period of time at a first selected temperature. A same state read (306) is performed on the first capacitor after the baking. Based on the results from the same state read, it is determined whether an error occurred. The first specified period of time can be from 10 minutes to 2 hours and the first selected temperature can be in a range from 85° C. to 150° C. A repair can be performed (310) to corrected detected errors. A related method (500) can detect imprinted bits using a same state write (502), followed by a relatively high temperature bake (504), then a same state read (506). An opposite state date write (508) is performed followed by a relatively low temperature bake (510), and then an opposite state data read (512) to identify opposite state error or imprint.

11 Claims, 2 Drawing Sheets

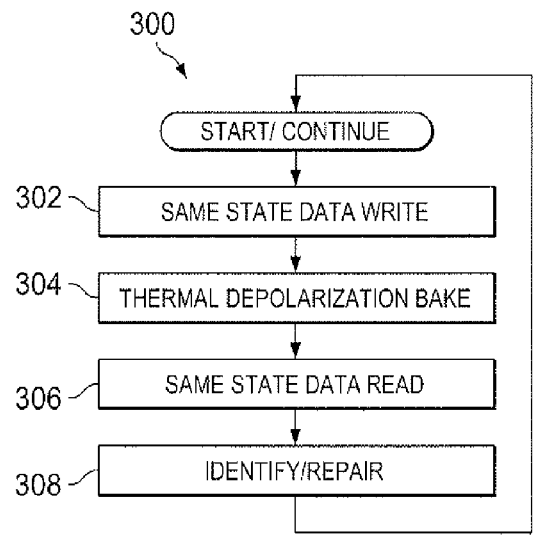
FIG. 3
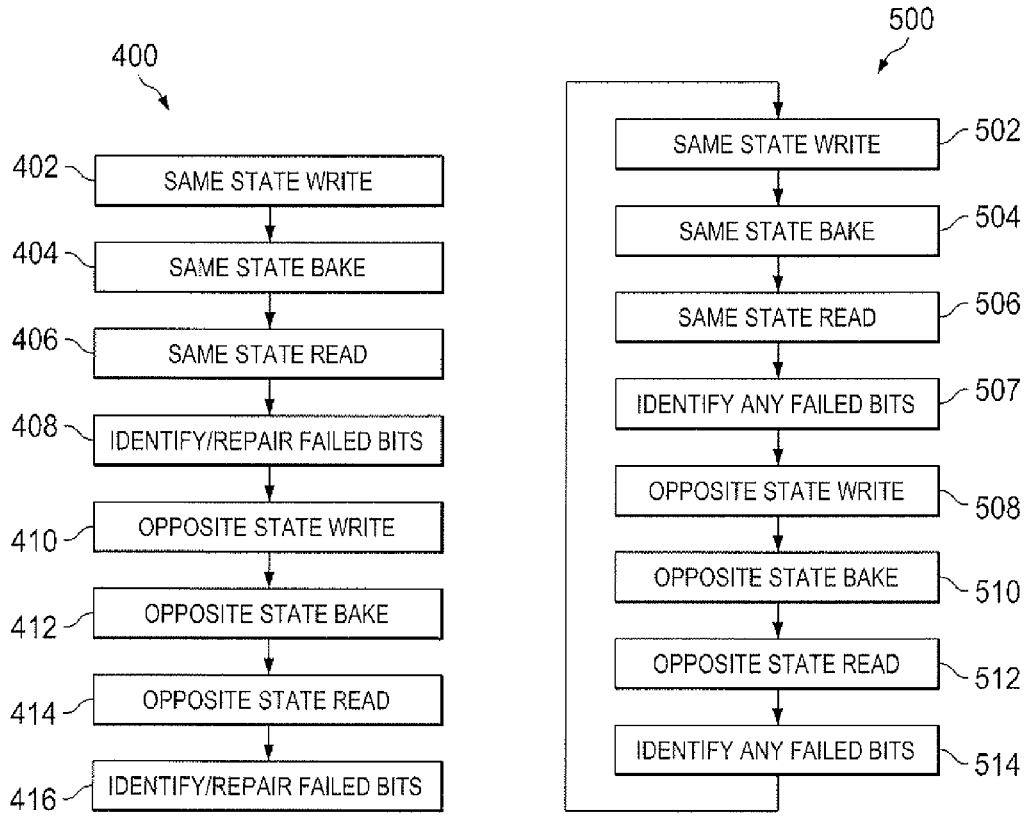
FIG. 4
FIG. 5

FERROELECTRIC MEMORY BRAKE FOR SCREENING AND REPAIRING BITS

FIELD OF INVENTION

The present invention relates generally to semiconductor devices and more particularly to ferroelectric memory (FRAM) comprising devices and methods for identifying and repairing selected bits in the ferroelectric memory.

BACKGROUND OF THE INVENTION

Ferroelectric memory devices, like other semiconductor memories, are used for storing data and/or program code in personal computer systems, embedded processor-based systems, and the like. Ferroelectric memories are commonly organized in single-transistor, single-capacitor (1T1C) or two-transistor, two-capacitor (2T2C) cell configurations, in which data is read from or written to the device using address signals and various other control signals. The individual memory cells typically include one or more ferroelectric capacitors adapted to store a binary data bit, as well as one or more access transistors, typically MOS devices. The access transistor in a 1T1C configuration operates to selectively connect one terminal of the ferroelectric capacitor to one of a pair of complimentary bitlines, with the other bitline being connected to a reference voltage and the other capacitor terminal being connected to a plateline pulse during read operations.

The ferroelectric memory cells are commonly organized as individual bits of a corresponding data word, wherein the cells of a given word are accessed concurrently through activation of platelines and wordlines by address decoding circuitry. Such devices are typically organized internally into blocks, sections, segments, rows and columns. When a data word is read, the cell data from the corresponding bit in each of the columns is sensed using individual sense amplifiers associated with the individual data cell columns.

Data in a ferroelectric memory cell is generally read by coupling complementary input terminals of a differential sense amp with one terminal of the cell capacitor a reference voltage. The other terminal of the capacitor is generally connected to a plateline pulse. The dipole switching in the ferroelectric capacitor resulting from the field across the ferroelectric capacitor terminals causes a switching current to flow, creating a differential voltage on the bitline pair coupled with the sense amp terminals. The reference voltage is typically supplied at an intermediate voltage between a voltage (V"0") associated with a capacitor charged to a binary "0" and that of the capacitor charged to a binary "1" (V"1"). The sense amp senses the differential voltage across the terminals and latches a voltage indicative of whether the target cell was programmed to a binary "0" or to a "1". The resulting amplified differential voltage at the sense amp terminals represents the data stored in the cell, which is applied to a pair of local IO lines. The sense amp drives one of the local IO lines to a different voltage state, by which the read data state is passed to an IO buffer circuit. The data is then restored to the ferroelectric cell capacitor, as the read operation is destructive in the sense the stored state is lost.

In a write operation, the complimentary sense amp and bitline terminals are generally connected to the local IO lines, which are driven to opposite voltage states depending on the data to be written. The wordline turns on the cell access transistor, coupling one of the ferroelectric capacitor terminals to one of the bitlines for storage of the write data into the ferroelectric capacitor, and the other capacitor terminal is connected to a plateline pulse. The applied field across the ferroelectric material in the ferroelectric capacitor provides dipole switching by which the cell is programmed according to the write data from the local IO. The transfer of data between the ferroelectric memory cell, the sense amp circuit, and the local IO lines is controlled by various access transistors, typically MOS devices, with switching signals being provided by control circuitry in the memory device (e.g., row decoders providing plateline signals and column decoders providing wordline signals to the access transistors in a 1T1C configuration).

The various read/write operations described supra utilize the ferroelectric properties, polarization, of the ferroelectric layer. Data retention is the ability of a memory cell, particularly a non-volatile memory cell, to properly maintain stored data. Proper operation, including data retention, of ferroelectric memory devices depends on the bi-stable characteristic of the ferroelectric memory cell described above. However, over time, the bi-stable characteristic can degrade significantly and negatively affect data retention. Thus, ferroelectric memory devices can, over time, become unusable for some applications.

It is known that the ferroelectric capacitors tend to imprint or develop a "preference" for a state at which they are raised to a relatively high temperature in, also referred to as baked. The initial state at which the ferroelectric capacitors are baked in, referred to as the same state, is generally stable, but can become so stable that the capacitors can preferentially want to remain there. However, the opposite state can become unstable or un-maintainable because of this developed preference for the baked or same state. Due to assembly induced degradation, imprint detection has generally been performed post assembly (e.g. at package test).

One known way to detect imprint is to initially write same state data to the ferroelectric capacitor, then bake the ferroelectric capacitor to a relatively high temperature, such as 125° C. to 150° C. for about 10 to 24 hours. The same state data is then read. Since the read operation is destructive, a rewrite normally follows a read operation. Opposite state data (opposite to the same state) is then written. A selected period of wait time may follow for stability. A read is operation is then performed. If the opposite state data is not successfully read, the ferroelectric capacitor can be determined to be imprinted, and thus the corresponding ferroelectric memory cell may be rejected.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An early fail mechanism for ferroelectric bits has been discovered by the present Inventors to be generally dominated by a weak polarization behavior of weak bits. This discovery has been used to develop a new methodology to perform screen and repair bakes. A relatively short and generally low temperature "thermal depolarization" bake developed by the present Inventors can be used to identify weak ferroelectric bits which can then be repaired. The thermal depolarization bake can also be applied to identify imprint failures following a high temperature bake. The thermal depolarization bake temperature can be guard banded up to about 50° C. (e.g. 15 to 50° C.) or more by the upper temperature for the device to demonstrate reliability for storage, operating or qualification. The thermal depolarization bake time is generally in the range of half an hour to a few hours (e.g. 2 to 4 hours). Methods according to the invention can be used to improve the reliability and yield of integrated circuits comprising ferroelectric memory.

A method of identifying failing bits in a ferroelectric memory device comprising a plurality of bits and at least one redundant bit, wherein the bits each comprise at least a first ferroelectric capacitor includes the step of writing same state data to the first capacitor. The first capacitor is baked for a specified period of time at a selected temperature. The ferroelectric memory device can comprise a ferroelectric memory array including 1T1C cells, 2T2C cells, or a combination thereof. A same state read is performed on the first capacitor after thermal polarization baking. Based on the results from the same state read, it can be determined whether an error occurred. A repair is performed using one of the redundant bits if it is determined that an error occurred.

A related method detects imprinted bits using a same state write, followed by a relatively high temperature bake, then a same state read. An opposite state date write is performed followed by a relatively low temperature bake compared to the high temperature bake (similar to the thermal depolarization bake described above), and then an opposite state data read to identify opposite state error or imprint.

BRIEF DESCRIPTION OF THE DRAWINGS

FIG. 3 is a flow diagram illustrating a method of analyzing ferroelectric capacitors using a thermal depolarization bake to identify weak bits, according to an embodiment of the invention.

FIG. 4 is a flow diagram illustrating a method of analyzing ferroelectric capacitors using a first and a second thermal depolarization bake to identify weak bits, according to an embodiment of the invention.

FIG. 5 is a flow diagram illustrating a method of analyzing ferroelectric capacitors which accelerates imprint related signal reduction including a thermal depolarization bake to identify imprint failing bits, according to an embodiment of the invention.

DETAILED DESCRIPTION

Figure 1:
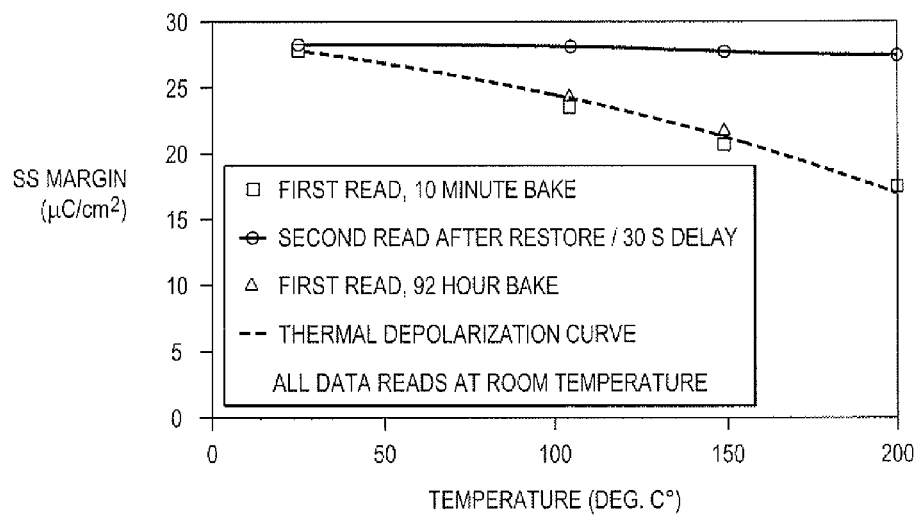
FIG. 1 is a plot of temperature vs. same state (SS) margin based on experimental data collected by the present Inventors for a ferroelectric bit that evidences the discovery by the present Inventors regarding the early fail mechanism of weak thermal depolarization behavior.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The present Inventors have discovered that an early fail mechanism for ferroelectric memory cells can be dominated by a weak polarization behavior of bits, referred to herein as "weak bits". Known ferroelectric memory screen bakes, which generally last for about 10 to 24 hours at 125° C. to 150° C., or more, are designed to detect imprint failures. In contrast, based on the Inventors' discovery of weak bit behavior, thermal depolarization screen bakes according to embodiments of the present invention can be used to detect weak bit behavior including imprint, and can be generally performed at a significantly lower temperature and for a shorter time as compared to known bakes. When the ferroelectric memory includes redundant bits, such as when row redundancy, column redundancy and/or micro-granularity redundancy (for individual bits) is provided, the identification of weak bits can be followed by a repair operation. Repair is known in the art for ferroelectric comprising memory devices (e.g. FRAM). For example, repair programming resources comprise a memory reference voltage, registers (or other memory) along with address matching circuitry. In the case of micro-granularity repair, redundancy can take its repair elements from redundant columns by performing a repair only when both the column and row addresses match.

FIG. 1 is a plot of temperature vs. same state (SS) margin based on experimental data collected by the present Inventors for a ferroelectric bit that evidences the discovery by the present Inventors that thermal depolarization behavior is detectable after a short bake, such as for only 10 minutes, which represents a highly unexpectedly short period of time relative to previously used bake times. The dashed line shown is the equilibrium thermal depolarization curve (reference curve) for a particular ferroelectric composition ($PbZr_{0.25}Ti_{0.75}O_3$ Tc=about 430° C.). More generally, the ferroelectric material can be $Pb(Zr,Ti)O_3$ (PZT), or other ferroelectric materials. Data for the first read after a 10 minute bake and first read after a 92 hour bake are both shown both to be near the reference thermal depolarization curve. Thus, the ferroelectric domains thermally depolarize to near the reference curve upon temperature exposure, even for a 10 minute bake, for temperatures tested up to 200° C.

FIG. 1 also includes a curve for SS margin a second read following a write restore and 30 second stabilization delay that evidences the write substantially restore poles the ferroelectric domains back into the same state. Since the short bake provides values near the reference thermal polarization curve, the Inventors have found a short thermal depolarization bake (e.g. 5 to 10 minutes to $\leq 2$ hours) followed by a read could alone be used to identify weak polarization behavior. In the case of weak polarization behavior, the data read after thermal depolarization bake would evidence a significantly reduced SS margin relative to the expected SS margin, allowing weak or failing bits to be identified, and be repaired for ferroelectric memories which include redundant bits.

Figure 2:
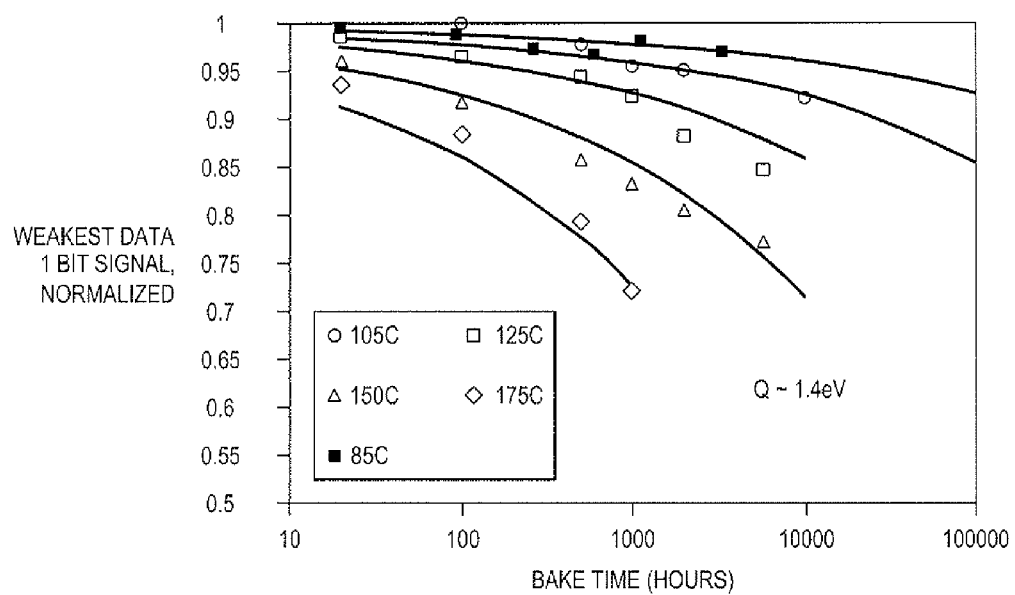
FIG. 2 is experimental data collected by the present Inventors that demonstrates the equivalency of thermal polarization bake conditions for different times and temperatures.

FIG. 2 is experimental data collected by the present Inventors that demonstrates the equivalency of thermal polarization bake conditions for different times and temperatures, As shown in FIG. 2, 100 hours of baking at 150° C. is approximately equal to 1,000 hours at 125° C. Both of these stress conditions approximate 10 years at 85° C. operation. The Q value shown is the empirically derived activation energy.

Turning now to FIG. 3, a flow diagram illustrating a method 300 of identifying weak bits including a thermal depolarization bake is provided according to an embodiment of the invention. The method 300 can provide an indication of the quality of the material employed with and the fabrication process of ferroelectric memory devices. The method 300 begins at 302 wherein same state data is written to the ferroelectric capacitor or memory array. The same state data is the initial states or values to which the capacitors are written at (e.g., for a 2T-2C architecture, the true capacitor—0, positive and the complement capacitor—1, negative or the true capacitor—1, negative and the complement capacitor—0, positive).

The written capacitors or memory arrays are baked for a specified period of time at a selected temperature at 304 to force thermal depolarization of weak bits. A suitable thermal depolarization bake temperature is typically based on the upper limit required to demonstrate reliability at a required storage, operating or qualification temperature. In addition, up to about a 10 to 50° C. guardband may be provided. For example, for a 125° C. qualification temperature, typically used for 85° C., 10 year product lifetime specifications, the bake can be performed at up to about 150° C. (a 250C guardband), 175° C. (a 50° C. guardband). In one embodiment a bake temperature of up to about 260° C. is used. The bake temperatures can be adjusted upward or downward depending on the product specification. A suitable time can be about 10 minutes to about 4 hours, generally 0.5 hours to 2 hours. Then, a same state read is performed at 306. Read testing is generally performed in the temperature range of 25 to 85° C. For a properly working ferroelectric cell, the read should read the same state data originally written at 302. Otherwise, an error has occurred. In the case of an error, at 308 after identification of the error, a repair operation is performed for the ferroelectric capacitors found to be in an error state.

It may be desirable to test each bit for both polarization states. FIG. 4 is a flow diagram illustrating a method 400 of analyzing ferroelectric capacitors using a first and a second thermal depolarization bake to identify weak bits, in accordance with an embodiment of the invention. Steps 402-408 are analogous to steps 302-308 described above relative to FIG. 3. A write operation of the complementary state is performed at 410 on the capacitors or memory arrays followed by an opposite state bake at 412, an opposite state read at 414 and an identify error/repair at 416. This method ensures both data states for each bit are screened for weak bit behavior. The repair can be consolidated at step 416 so that step 408 only identifies failed bits.

In one embodiment, all non-redundant bits in each memory are tested at wafer level for weak bit behavior in both states using method 400. Using method 400, it may be possible to provide high reliability for the memory array without using a subsequent imprint test including a high temperature bake.

However, embodiments of the present invention can also be used to detect bits that may pass methods 300 or 400 (and thus not be weak polarization bits as described above), but be subject to imprint related errors. Turning now to FIG. 5, a flow diagram illustrating a method 500 of identifying imprintable bits including a thermal depolarization bake according to an embodiment of the invention is provided. The method 500 can employ 1T-1C or 2T-2C cell architectures, or combinations thereof described above relative to FIG. 3. Additionally, the method 500 can provide an indication of an expected operational lifetime for the ferroelectric capacitors. Expected operational lifetime can be determined from experimental data, such as shown in FIG. 2 and described above (100 hours of baking at 150° C. is approximately equal to 1,000 hours at 125° C.; both of these stress conditions approximate 10 years at 85° C. operation).

High temperatures relative to the thermal depolarization bake can be employed by method 500 for reliability/qualification testing after weak bit polarization screening using the invention, such as method 300 or 400, in order to accelerate imprint related signal reduction. Method 500 can verify that the memory array passes with no fails. Method 500 generally does not include a repair step. Should one or more fails be detected, methods 300 or 400 or variants thereof can be repeated, at generally more aggressive conditions (added time or temperature), and repairs performed therein.

The method 500 begins at 502 wherein same state data is written to a plurality of the ferroelectric capacitors, generally using a sampling plan. The same state data can be the initial states or values to which the capacitors are written at (e.g., the first capacitor—0, positive and the second capacitor—1, negative or the first capacitor—1, negative and the second capacitor—0, positive). The first capacitor and the second capacitor are same state baked for a specified period of time at a selected temperature at 504, A suitable temperature for the same state bake is typically in the range of about greater than 85° C. and less than about 250° C., and a suitable time can be about 10 minutes to about 3,000 cumulative hours. The baking at elevated temperature for a period of time simulates a much longer length of time at normal operational temperatures. For example, a bake of 100 hours at 150° C. simulates about 10,000 hours of operation at 105° C. Then, a same state read is performed at 506 that, for a properly working ferroelectric cell, should read the same state data originally written at 502. Failed bits (if present) are identified at 507.

At 508, opposite state data (i.e., states opposite to that originally written to the capacitors) is written to the first capacitor and the second capacitor. Thus, if a logical 0 was initially written to the first capacitor, a logical 1 is now written to the first capacitor. A delay or wait for a selected period of time can be performed to allow the first and second capacitors to achieve a steady state. At 510 an opposite state "thermal depolarization" bake is performed. The bake at 510 can be performed as described above relative to method 300 and 400 and is generally for 10 minutes to 4 hours, such as 10 minutes to 30 minutes at a required storage, operating or qualification temperature for the IC. The temperature for the bake at 510 can be 85° C. to about 200° C. Then, an opposite state read is performed at 512 in which the first capacitor and the second capacitor are read in order to identify opposite state error or imprint. A signal state margin can be obtained for each capacitor by comparing voltages across the capacitors from the opposite state read with the same state read obtained at 506. The read data at 512 should match the opposite state data written at 508 if the ferroelectric material within the first and second capacitors are properly operating. However, time and elevated temperatures at the high temperature bake 504 can cause a condition that permits the thermal depolarization bake at step 510 to reveal imprint failures, where the capacitors return to the same state. Step 514 can comprise identification of the capacitors determined to be imprinted (and thus failed) at step 512. As shown in FIG. 5, the method 500 can be iteratively repeated to identify points of failure and to simulate extended periods of time (e.g., product lifetime, 10 years, and the like).

It is appreciated that voltages across the first ferroelectric capacitor and the second ferroelectric capacitor can be obtained and stored throughout the methods described herein. It is also appreciated that the methods can be extended and adapted to employ varying numbers of capacitors instead of just two in order to identify weak bits or imprint.

Although bakes have been described as being performed without bias, any of the bakes can be performed under bias, with test temperatures generally in the range of −40° C. to 85° C., such as room temperature. In addition, methods according to the invention can generally be performed at either wafer level (wafer probe) or package level (package test).

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. A method of identifying failing bits in a ferroelectric memory device comprising:
    writing same state data to a first ferroelectric capacitor;
    baking said first ferroelectric capacitor while in said same state for a first specified period of time at a first selected temperature;
    performing a same state read on said first ferroelectric capacitor after said baking,
    immediately after said same state read, determining whether a same state error occurred on said first ferroelectric capacitor; and
    repairing said first ferroelectric capacitor with a redundant bit if said same state error occurred.

2. The method of claim 1, wherein said first specified period of time is from 10 minutes to 4 hours and said first selected temperature is in a range from 85° C. to 260° C.

3. The method of claim 1, wherein said first specified period of time is from 10 minutes to 2 hours and said first selected temperature is in a range from 85° C. to 150° C.

4. The method of claim 1, further comprising:
    writing opposite state data to said first ferroelectric capacitor;
    baking said first ferroelectric capacitor while in said opposite state for a second specified period of time at a second selected temperature;
    performing an opposite state read on said first ferroelectric capacitor after said baking in said opposite state;
    determining whether an opposite state error occurred, and repairing said first ferroelectric capacitor with said redundant bit if said opposite state error occurred.

5. The method of claim 1, wherein said at least a first ferroelectric capacitor comprises said first ferroelectric capacitor and a second ferroelectric capacitor, wherein said same state data is a one state data in said first ferroelectric capacitor and a zero state for said second ferroelectric capacitor.

6. The method of claim 1, wherein said ferroelectric memory device comprises a ferroelectric memory array, wherein each bit in said ferroelectric memory array is tested by said method.

7. The method of claim 6, further comprising the step of performing lifetime testing by sampling a plurality of bits in said ferroelectric memory array device to determine estimated data retention lifetimes by performing a high temperature bake relative to said first temperature and monitoring an amount of imprint related signal margin reduction after said high temperature bake.

8. The method of claim 1, wherein said method is performed at wafer level.

9. The method of claim 1, wherein said method is performed at package level.

10. A method of identifying failing bits in a ferroelectric memory device comprising, comprising:
    writing same state data to a first ferroelectric capacitor;
    baking said first ferroelectric capacitor while in said same state for a first specified period of time at a first selected temperature;
    performing a same state read on said first ferroelectric capacitor after said baking,
    determining whether a same state error occurred,
    repairing said first ferroelectric capacitor with said redundant bit if said same state error occurred, and
    performing lifetime testing by sampling a plurality of bits in said ferroelectric memory device to determine estimated data retention lifetimes by performing a high temperature bake relative to said first temperature and monitoring an amount of imprint related signal margin reduction after said high temperature bake.

11. A method of identifying failing bits in a ferroelectric memory device comprising, comprising:
    writing same state data to a first ferroelectric capacitor;
    baking said first ferroelectric capacitor while in said same state for a first specified period of time at a first selected temperature;
    performing a same state read on said first ferroelectric capacitor after said baking,
    determining whether a same state error occurred,
    repairing said first ferroelectric capacitor with said redundant bit if said same state error occurred,
    writing opposite state data to said first ferroelectric capacitor;
    baking said first ferroelectric capacitor while in said opposite state for a second specified period of time at a second selected temperature;
    performing an opposite state read on said first ferroelectric capacitor after said baking in said opposite state;
    determining whether an opposite state error occurred,
    repairing said first ferroelectric capacitor with said redundant bit if said opposite state error occurred, and performing lifetime testing by sampling a plurality of bits in said ferroelectric memory device to determine estimated data retention lifetimes by performing a high temperature bake relative to said first temperature and monitoring an amount of imprint related signal margin reduction after said high temperature bake.

* * * * *

UNITED STATES PATENT AND TRADEMARK OFFICE
CERTIFICATE OF CORRECTION

PATENT NO. : 7,813,193 B2  Page 1 of 1
APPLICATION NO. : 12/142568
DATED : October 12, 2010
INVENTOR(S) : John Anthony Rodriguez et al.

It is certified that error appears in the above-identified patent and that said Letters Patent is hereby corrected as shown below:

On the Title page and col. 1 lines 1 and 2
Item (54), the Title should appear as follows:

"FERROELECTRIC MEMORY BAKE FOR SCREENING AND REPAIRING BITS"

Signed and Sealed this

Thirtieth Day of November, 2010

David J. Kappos
*Director of the United States Patent and Trademark Office*